(12) United States Patent  
Calvert

(10) Patent No.: US 8,319,588 B2  
(45) Date of Patent: Nov. 27, 2012

(54) HOLLOW CYLINDRICAL THERMAL SHIELD FOR A TUBULAR CRYOGENICALLY COOLED SUPERCONDUCTING MAGNET

(75) Inventor: Simon James Calvert, Witney (GB)

(73) Assignee: Siemens Plc, Frimley, Camberley (GB)

( * ) Notice: Subject to any disclaimer, the term of this patent is extended or adjusted under 35 U.S.C. 154(b) by 0 days.

(21) Appl. No.: 13/245,243

(22) Filed: Sep. 26, 2011

(65) Prior Publication Data

US 2012/0075045 A1 Mar. 29, 2012

(30) Foreign Application Priority Data

Sep. 28, 2010 (GB) .................................. 1016290.7

(51) Int. Cl.
*H01F 6/00* (2006.01)
*F25B 19/00* (2006.01)
*G01V 3/00* (2006.01)

(52) U.S. Cl. ......... 335/216; 324/318; 324/319; 62/51.1; 505/879; 505/892; 505/893; 505/898

(58) Field of Classification Search .................. 335/216; 324/318–320; 62/51.1; 505/879, 892, 893, 505/898
See application file for complete search history.

(56) References Cited

U.S. PATENT DOCUMENTS

| 5,045,826 | A * | 9/1991 | Laskaris ...................... 335/301 |
| 6,552,543 | B1 | 4/2003 | Dietz |
| 7,514,928 | B2 | 4/2009 | Westphal |
| 7,535,225 | B2 | 5/2009 | Dietz et al. |
| 2003/0006773 | A1 | 1/2003 | Ries |
| 2008/0197850 | A1 | 8/2008 | Dietz et al. |

FOREIGN PATENT DOCUMENTS

| EP | 0228683 A2 | 7/1987 |
| JP | 05335137 A | 12/1993 |

* cited by examiner

*Primary Examiner* — Ramon Barrera
(74) *Attorney, Agent, or Firm* — Schiff Hardin LLP

(57) ABSTRACT

A hollow cylindrical thermal shield for a tubular cryogenically cooled superconducting magnet, has a first axis, an inner cylindrical tube having an axis aligned with the first axis, an outer cylindrical tube of greater diameter than the diameter of the inner cylindrical tube, having an axis aligned with the first axis, and annular end pieces, joining the inner cylindrical tube and the outer cylindrical tube to form an enclosure. The hollow cylindrical thermal shield further has a cylindrical stiffener, extending axially at least part of the axial length of the inner cylindrical tube, the stiffener being joined at intervals to the inner cylindrical tube, thereby to improve the mechanical rigidity of the inner cylindrical tube.

32 Claims, 8 Drawing Sheets

FIG 5
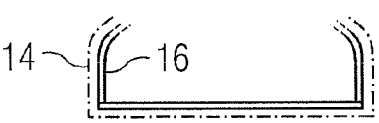
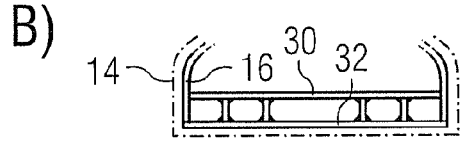
FIG 6
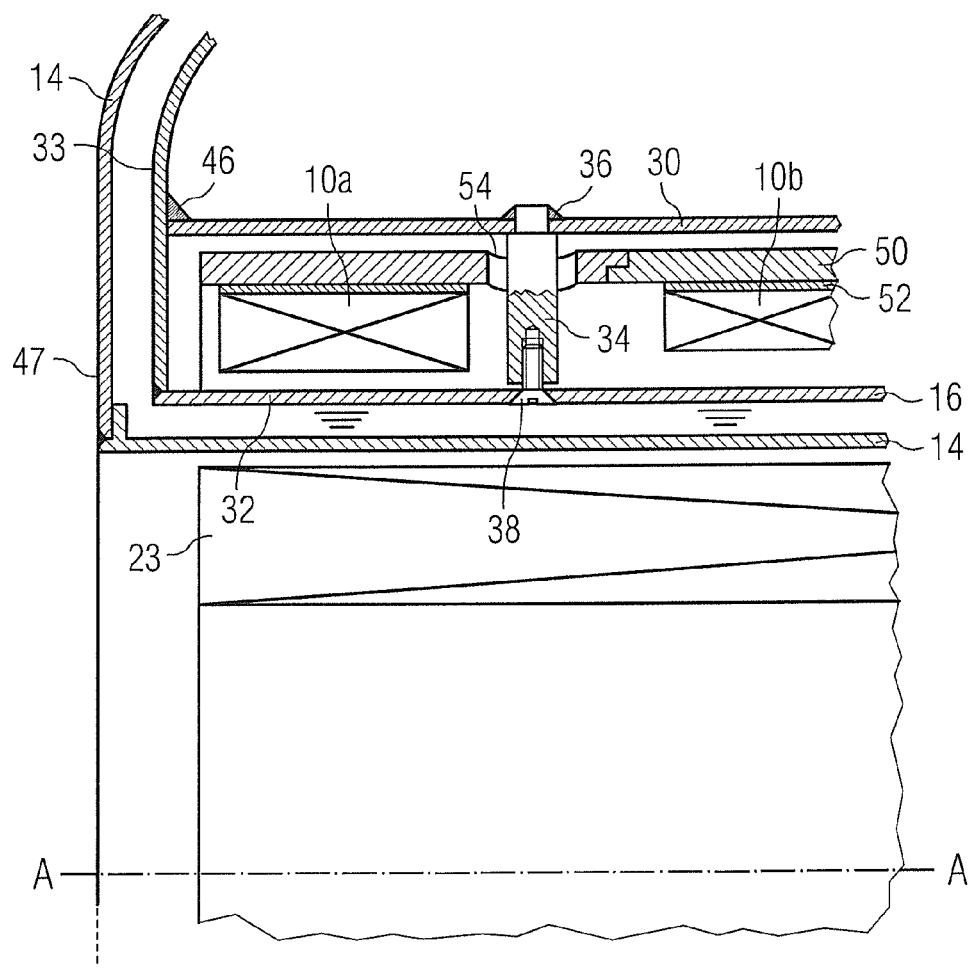

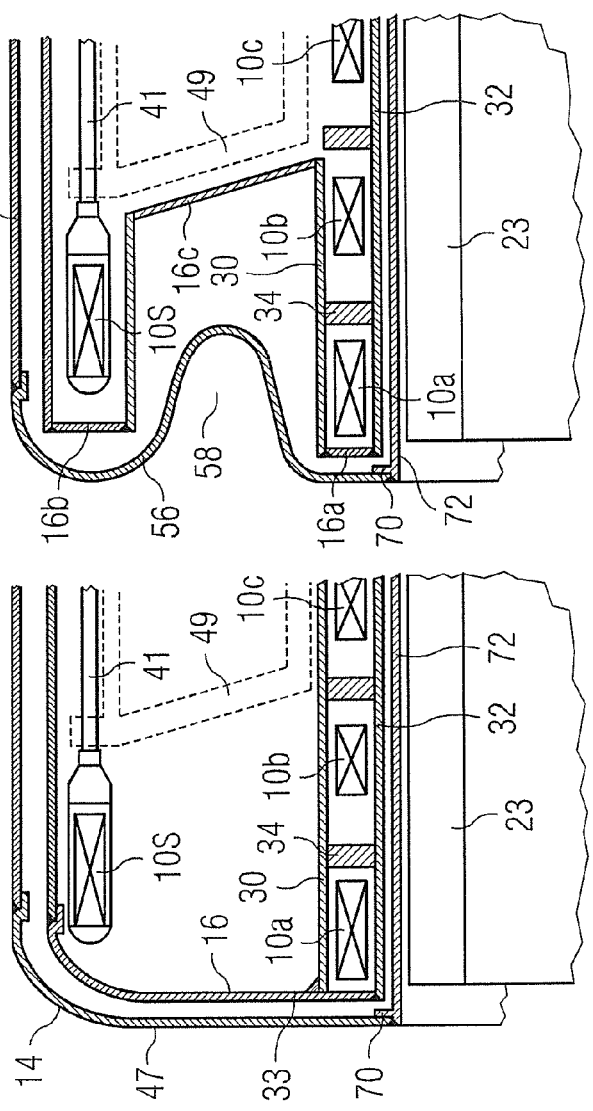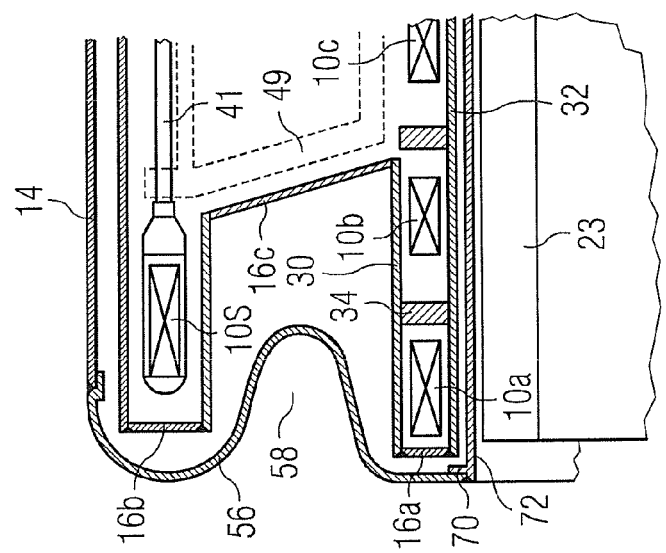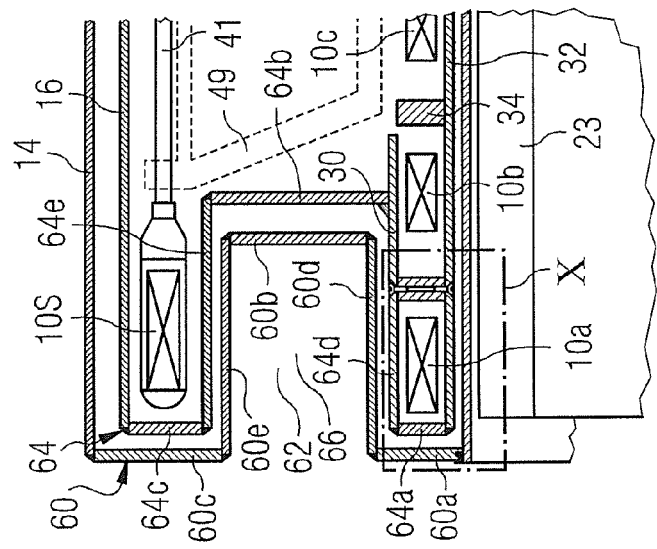
FIG 9

HOLLOW CYLINDRICAL THERMAL SHIELD FOR A TUBULAR CRYOGENICALLY COOLED SUPERCONDUCTING MAGNET

BACKGROUND OF THE INVENTION

1. Field of the Invention

The present invention relates to a hollow cylindrical thermal shield for a tubular cryogenically cooled superconducting magnet, and particularly to such a thermal shield which is useful in MRI (Magnetic Resonance Imaging) systems due to reduction in gradient coil induced heating (GCIH) of cryogenically cooled apparatus.

2. Description of the Prior Art

Superconducting magnets for use in MRI systems are commonly cylindrical in shape, and the present invention is directed to such magnets. In an MRI system, a gradient coil assembly provides pulsed magnetic fields to provide the required spatial encoding of the imaging volume. Such time-variant magnetic fields will induce heating into conductive materials in the vicinity.

FIG. 1 illustrates a typical arrangement of an MRI magnet system. Coils 10 are wound onto a former (not shown) which is placed within a cryogen vessel 12. The cryogen vessel is partially filled with a liquid cryogen 15 such as helium to provide the required cooling. A thermal radiation shield 16 surrounds the cryogen vessel to shield it from radiated heat. The cryogen vessel and the thermal shield are cooled by a cryogenic refrigerator 17. The coils, former, cryogen vessel and thermal radiation shield are surrounded by an outer vacuum chamber (OVC) 14. The volume between the outer vacuum chamber 14 and the cryogen vessel 12 is evacuated. Solid thermal insulation 18, such as aluminized polyester film, is preferably placed in the space between the outer vacuum chamber 14 and the thermal radiation shield 16. Numerous other components, such as mechanical support structures, are provided in a practical MRI magnet system, but are not illustrated in the drawing for the sake of clarity. In designing an MRI system, great effort is placed on reducing thermal influx to the cryogen vessel; on maximizing the diameter of the bore of the outer vacuum chamber; and on reducing its length.

A cylindrical gradient coil assembly is typically placed within the bore of the outer vacuum chamber.

The cryogen vessel, thermal radiation shield and outer vacuum container are each typically hollow cylindrical enclosures, each composed of an inner tube, an outer tube and two annular end pieces joining the inner tube and the outer tube.

The inner tube of the thermal radiation shield is typically of a highly electrically and thermally conductive material, such as pure aluminum, and is about 6 mm thick. Such material is effective at shielding the cryogen vessel from high-frequency (>100 Hz) varying magnetic fields from the gradient coil assembly. Relatively large eddy currents may be induced in the inner tube of the thermal radiation shield due to the pulsing of a magnetic field by the gradient coils. Such eddy currents cause heating of the thermal radiation shield.

However, secondary and tertiary eddy currents remain a problem. Although the cryogen vessel is not subjected to the high-frequency varying magnetic fields of the gradient coils, the magnetic pulsing of the gradient coils causes mechanical vibration of the OVC and the thermal radiation shields. These vibrations, within the magnetic field of the coils, cause induced eddy currents in the material of the OVC and the thermal radiation shields. These induced eddy currents in turn cause heating; and the magnetic fields generated by the induced eddy currents induce further eddy currents, and cause heating, in the cryogenically cooled components such as coils 10 and cryogen vessel 12. All of such heating is collectively known as gradient coil induced heating (GCIH).

The heating is particularly pronounced in cases where the pulsing of the gradient coils is at a frequency near the resonant frequencies of the inner tube of the OVC and the inner tube of the thermal radiation shield. It is believed that the proximity of the resonant frequencies is a feature of nested tubes of similar dimensions, even where the tubes are of differing materials.

In magnet systems such as illustrated in FIG. 1, the coils 10 themselves are cooled by liquid cryogen 15 and will not be heated by the GCIH. However, an increased boil-off of cryogen will occur due to GCIH of the cryogen vessel and the coils and radiant heating caused by GCIH of the thermal radiation shield.

Recent developments have led to magnets described as "low cryogen inventory" or even "dry" magnets. In such designs, little or no liquid cryogen is provided to cool the magnets. In "low cryogen inventory" magnets, a relatively small volume of cryogen circulates in thermal contact with the magnet coils, and is cooled by a cryogenic refrigerator as it circulates. In a "dry" magnet, no cryogen is provided, but a cryogenic refrigerator is thermally linked to the magnet through a thermally conductive link such as a copper or aluminum braid or laminate.

In "low cryogen inventory" or "dry" magnets, there is not a large volume of cryogen to absorb heating of the cryogen vessel or the shield due to GCIH. As a result, there is a risk that the coils 10 will heat, and quench, even in response to a relatively small amount of heating. It is therefore particularly important to minimize GCIH in "low cryogen inventory" or "dry" magnets. This may be addressed by intercepting heat generated by GCIH, either in the gradient coils, at the OVC inner tube, or at the thermal shield. The present invention is particularly directed to intercepting the majority of heat resulting from GCIH at the thermal radiation shield.

Some attempts have already been made to address this problem. In some arrangement (e.g. U.S. Pat. No. 7,514,928), the cryogen vessel has been coated or lined with copper. This does not prevent or reduce the magnitude of eddy currents in the cryogen vessel, but reduces the resultant heating due to the reduced electrical resistance of the cryogen vessel. This approach has been found to have limited success, as the reduced resistance of the cryogen vessel has been found to lead to increased eddy currents.

The mechanical vibration of the inner tube of the thermal shield has been addressed (e.g. U.S. Pat. No. 7,535,225) by bonding patches of a high modulus material, such as carbon-fiber reinforced plastic CFRP, onto the shield's inner tube. Such an approach has been found effective to change the resonant frequency of the shield's inner tube only if a significant radial thickness of stiffening material is used. This results in an increase in the diameter of the coils, and a great increase in wire cost, in order to keep the bore of the OVC at the required diameter.

SUMMARY OF THE INVENTION

Problematic peaks in GCIH occur when the gradient coils are pulsed at frequencies close to the resonant frequencies of both the inner tubes of the thermal radiation shield and the OVC. Problematic mechanical resonance of the inner tubes may be reduced by separation of the resonant frequencies of inner tube of the OVC and the inner tube of the thermal radiation shield. Furthermore, the magnitude of resonance may be reduced by substantial stiffening of the shield bore tube thereby to minimize the amplitude of mechanical vibration, and so reduce the magnitude of any secondary or tertiary eddy currents and heating induced in the thermal radiation shield, the cryogen vessel or other cryogenically cooled components.

The present invention accordingly provides a structure having a stiffer (more mechanically rigid) inner tube of the thermal radiation shield. The inner tube of the thermal radiation tube may be effectively made heavier, yet without increasing the required coil diameter. There need be no increase in wire cost, or reduction in bore diameter of the thermal radiation shield.

The stiffened inner tube of the thermal radiation shield provides substantial separation of resonant frequencies of the inner tubes of the OVC and the thermal radiation shield. The amplitude of mechanical vibration due to gradient coil pulsing is reduced, leading in turn to reduced eddy currents in the cold mass.

The present invention includes a hollow cylindrical thermal radiation shield having an inner cylindrical tube, and a cylindrical stiffener, extending axially at least part of the axial length of the inner cylindrical tube. The stiffener is of greater diameter than the inner cylindrical tube, and is joined at intervals to the inner cylindrical tube, thereby to improve the mechanical rigidity of the inner cylindrical tube.

Preferably, the inner cylindrical tube of the thermal radiation shield is thinner than in a conventional arrangement, allowing coil diameters to be reduced, saving wire cost; or the bore diameter of the OVC may be increased.

According to an aspect of the invention, the cylindrical stiffener is able to react much of the force on the inner tube and end pieces of the thermal radiation shield, enabling the inner tube itself to be of thinner material than is conventional. This in turn may permit a reduction in the diameter of the magnet coils, and a corresponding reduction in wire cost; or the bore diameter of the OVC may be increased. Furthermore, the inner tube and end pieces of the thermal radiation shield may be constructed of high purity aluminum.

The present application may be applied to "low cryogen inventory" or "dry" magnets, as well as to conventional "wet" magnets in which the superconducting coils are cooled by partial immersion in liquid cryogen.

BRIEF DESCRIPTION OF THE DRAWINGS

FIGS. 5A and 5B show comparative simplified partial cross sections of a conventional OVC with a conventional thermal radiation shield and a conventional OVC with a thermal radiation shield according to an embodiment of the invention.

FIG. 6 shows an axial part cross-section of an embodiment of the invention.

FIGS. 9A-9C illustrate alternative arrangements for annular end pieces of thermal radiation shields and OVCs.

DESCRIPTION OF THE PREFERRED EMBODIMENTS

Figure 1:
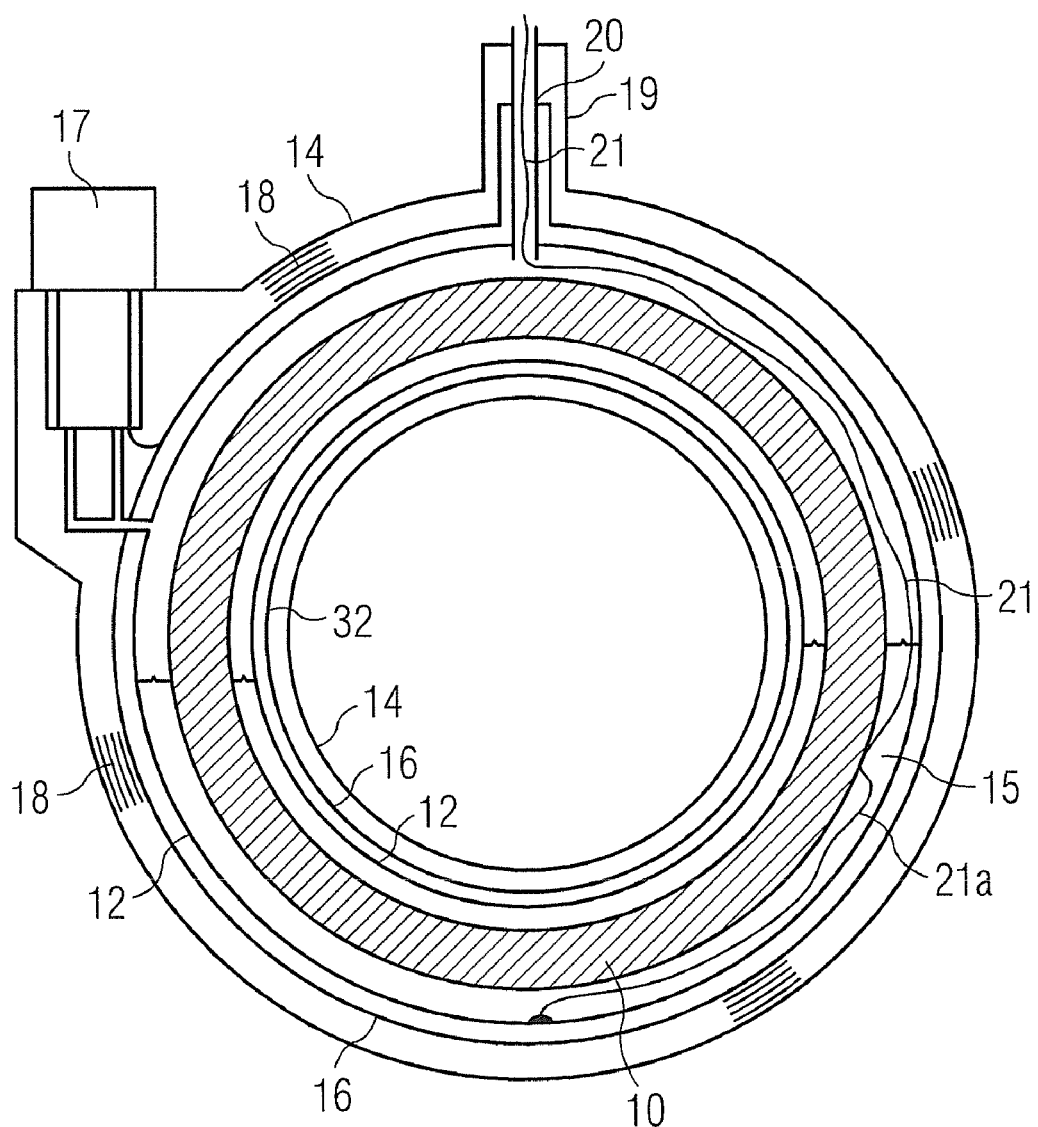
FIG. 1 shows a cross-section of a conventional superconducting magnet system for MRI.
Figure 2:
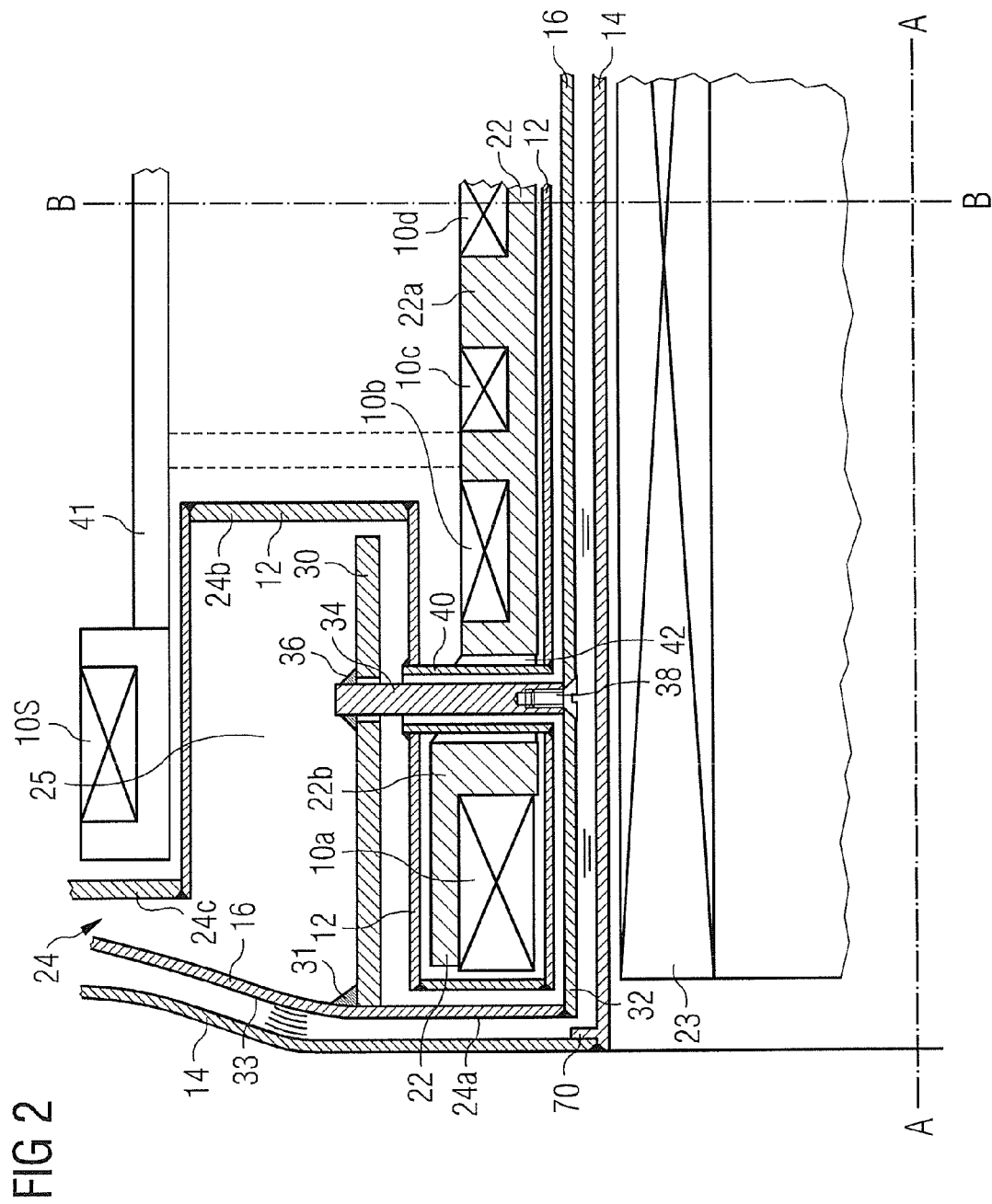
FIG. 2 shows an axial part cross section of an embodiment of the invention.

FIG. 2 shows an embodiment of the present invention, as applied to a "wet" magnet. Features corresponding to features of FIG. 1 are identified by corresponding reference numerals. FIG. 2 represents a part-axial cross section. The cross-section essentially has reflectional symmetry about axial centre line B-B and the magnet system is essentially symmetrical about axis A-A.

In the illustrated arrangement, coils $10a$, $10b$, $10c$, $10d$ are mounted on a former 22. As is well-known in the art, the former may be made up of three parts: a central part $22a$ carrying central coils $10b$, $10c$, $10d$, and two end-parts $22b$ each carrying an end coil $10a$.

Active shield coils $10s$, well known in themselves, are arranged on a separate mechanical support 41 at a greater radius about axis A-A than the central coils $10b$, $10c$, $10d$. A cryogen vessel 12 surrounds the coils and former, and retains a liquid cryogen.

According to a feature of this embodiment of the invention, the annular end piece 24 of the cryogen vessel 12 is made up of three concentric pieces $24a$, $24b$, $24c$. The annular end piece 24 of the cryogen vessel has a re-entrant portion 25, such that a radially intermediate piece $24b$ of the annular end piece 24 is axially closer to the axial centre B-B of the cryogen vessel than the radially inner $24a$ and radially outer $24c$ piece of the annular end piece. Auxiliary equipment may be installed within the re-entrant portion, if desired.

According to a feature of the invention, the thermal shield further comprises a cylindrical stiffener 30, extending axially part of the axial length of the inner cylindrical tube 32 of the thermal radiation shield 16. In the illustrated embodiment the stiffener 30 is at least partially accommodated within the re-entrant portion 25, between the cryogen vessel 12 and the thermal radiation shield 16. In the illustrated embodiment, the stiffener 30 is welded 31 to the annular end piece 33 of the thermal radiation shield 16, but any suitable method of fastening may be used.

The stiffener 30 is joined at intervals to the inner cylindrical tube 32 by pillars 34. In the illustrated embodiment, pillars 34 are positioned at radial intervals around the circumference of the inner tube 32. The pillars may all be arranged at a same axial location, axially between end coils $10a$ and the nearest central coil $10b$. The pillars may be arranged at differing axial positions, as limited by the axial positions of the coils $10a$, $10b$.

In the illustrated embodiment, the pillars 34 are welded 36 to the stiffener 30 and attached to the inner tube 32 of the thermal radiation shield by a countersunk screw 38. However, any appropriate method of fastening may be used.

Each of the pillars 34 passes through a cross-bore 40 in the cryogen vessel 12. Each pillar 34 passes through a cross-bore 40 so as to extend between the inner tube 32 of the thermal radiation shield and the cylindrical stiffener 30. Each cross-bore 40 is a tubular, preferably cylindrical, tube of internal diameter somewhat larger than the diameter of the corresponding pillar 34. The illustrated example shows the cross-bore tube welded into place in the cryogen vessel. While any suitable method of attachment may be used, welding may be preferred as it can be made leak-tight and mechanically robust. A corresponding hole 42 must be provided in the former 22 at each location where a cross-bore is provided, to enable the cross-bore 40 to provide access between the inner tube 32 of the thermal radiation shield 16 and the stiffener 30.

The axial extremities of the inner tube 32 of the thermal radiation shield 16 are the parts which are most affected by the pulsed magnetic field of the gradient coils in operation. The axial extremities are significantly stiffened by their mechanical linking to the cylindrical stiffener 30. This results in reduced mechanical vibration of the inner tube 32 in response to pulsed magnetic field from the gradient coils, in turn leading to reduced GCIH heating of the thermal radiation shield and reduced secondary eddy current heating of the cryogen vessel 12 and the coils 10. The thermal radiation shield is braced by the cylindrical stiffener, giving high rotational stiffness to the joint between the end piece 33 and the inner tube 32.

Figure 3:
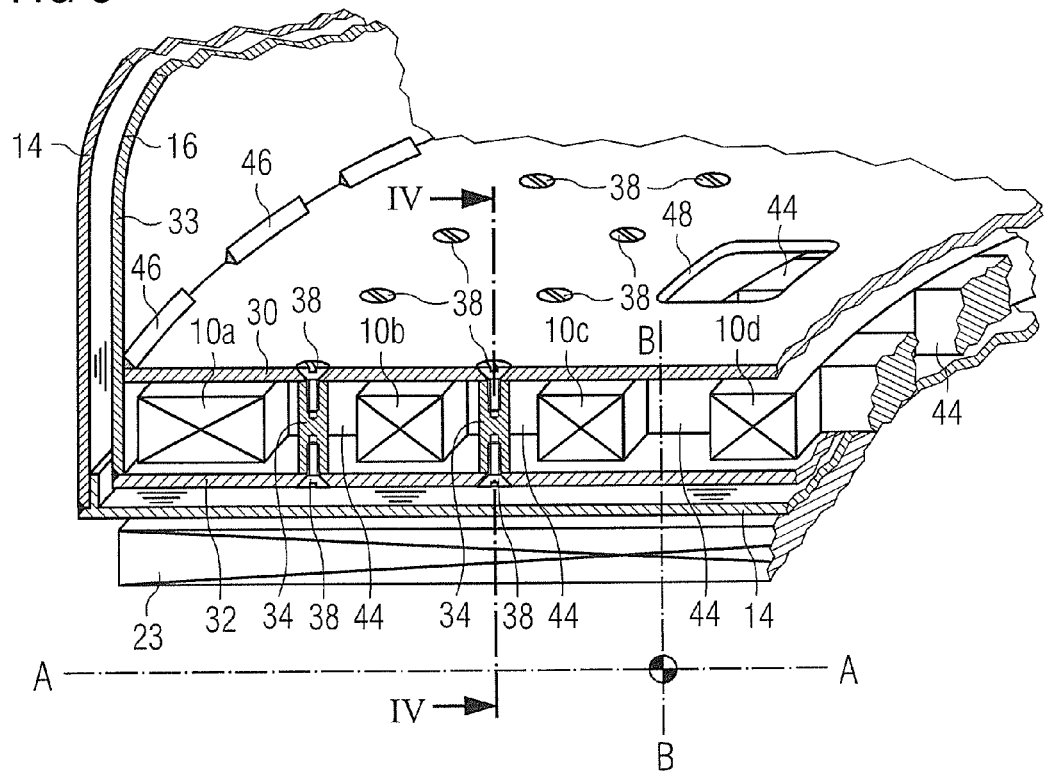
FIG. 3 shows a partial cut-away view of an embodiment of the invention.

FIG. 3 illustrates a partial cut-away view of another embodiment of the present invention. Features corresponding to features shown in FIGS. 1, 2 carry corresponding reference numerals.

In the embodiment of FIG. 3, the magnet coils 10a-10d are constructed as a self-supporting assembly, for example a resin-impregnated series of coils with axially oriented supporting spacers 44 formed as an integrated monolithically impregnated component. As such, a former such as shown in FIG. 2 is not required. Furthermore, the magnet of FIG. 3 is a "dry" magnet. No cryogen vessel is supplied, but the magnet coils 10 are cooled by thermal conduction to a cryogenic refrigerator (not illustrated).

In this embodiment, the cylindrical stiffener 30 extends the full axial length of the magnet. It is attached to both annular end pieces 33 of the thermal radiation shield 16. In the illustrated embodiment, this attachment is achieved by a discontinuous welding 46, although any suitable method may be used. Openings 48 may be provided in the cylindrical stiffener, to permit attachment of shield coils (not illustrated) to the remainder of the magnet, by any suitable means, and for attachment of mechanical supports to the coils, preferably by mechanical attachment to spacers 44.

The stiffener 30 is joined at radial and axial intervals to the inner cylindrical tube 32 by pillars 34. In the illustrated embodiment, pillars 34 are positioned at radial intervals around the circumference of the inner tube 32 at various axial positions. The pillars are arranged at axial locations between coils 10, and at radial circumferential positions between axially-oriented spacers 44.

In the illustrated embodiment, the pillars 34 are attached to the stiffener 30 and to the inner tube 32 of the thermal radiation shield by countersunk screws 38. However, any appropriate method of fastening may be used.

The inner tube 32 of the thermal radiation shield is significantly strengthened by its mechanical linking to the cylindrical stiffener 30. This results in reduced mechanical vibration of the inner tube 32 in response to pulsed magnetic field from the gradient coils, in turn leading to reduced GCIH and reduced secondary and tertiary eddy current heating of the thermal radiation shield. As the axial extremities are most susceptible to secondary eddy current generation, it may be found sufficient to mechanically link the stiffener 30 and the inner tube 32 only in the regions of the axial extremities, near end coils 10a.

Figure 4:
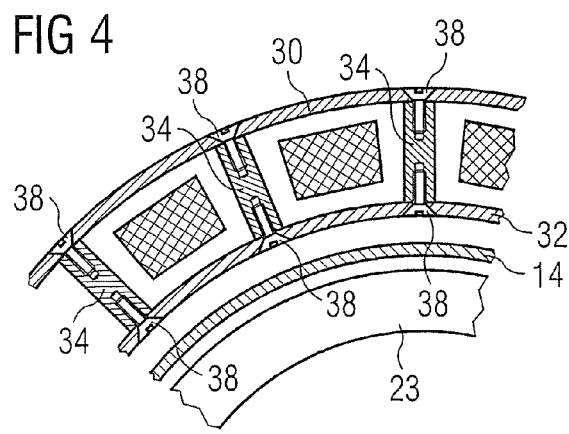
FIG. 4 shows a partial radial cross-section through the structure of FIG. 3.

FIG. 4 shows a partial radial cross-section through the structure of FIG. 3, at a position corresponding to axial position IV-IV.

FIGS. 5A and 5B show simplified partial cross sections comparing a conventional OVC 14 and thermal radiation shield 16 (FIG. 5A) with a cryogen vessel 14 and thermal radiation shield 16 provided with a stiffener 30 according to the present invention (FIG. 5B). This diagram clearly illustrates that the stiffener of the present invention does not reduce the available inner tube diameter of the OVC. Indeed, use of stiffener 30 according to the invention may allow a thinner inner tube 32 to be used increasing the available inner tube diameter of the OVC.

FIG. 6 illustrates a partial axial cross-section of a superconducting magnet assembly according to another embodiment of the present invention. Again, only one axial extremity of the assembly is illustrated, and the assembly is substantially symmetrical about axis A-A.

In this embodiment, coils 10a, 10b are attached on their radially outer surface to an external former 50. An intermediate layer 52, for example of epoxy-impregnated fiberglass cloth, may be provided between the coil 10 and the external former 50. The external former may be a single tubular piece, for example of fiberglass reinforced epoxy resin, or may be made up of several pieces, as illustrated, which may be arranged to interlock by suitable end-profiling.

In the embodiment of FIG. 6, the magnet coils 10 are constructed as self-supporting resin-impregnated coils externally attached to a cylindrical support 50. As such, the former of FIG. 2 is not required. Furthermore, the magnet of FIG. 6 is a "dry" magnet. No cryogen vessel is supplied, but the magnet coils 10 are cooled by thermal conduction to a cryogenic refrigerator (not illustrated).

In this embodiment, the cylindrical stiffener 30 extends the full axial length of the magnet. It is attached to both annular end pieces 24 of the thermal radiation shield 16. In the illustrated embodiment, this attachment is achieved by welding 46, although any suitable method may be used.

The stiffener 30 is joined to the inner cylindrical tube 32 at radial intervals around the circumference of the inner tube 32 by pillars 34. The pillars are arranged at axial locations between coils 10, and through holes 54 formed in the cylindrical support 50 between end coils 10a and adjacent central coils 10b. If required, a further series of pillars may be provided at another axial location, between adjacent coils.

In the illustrated embodiment, the pillars 34 are attached to the inner tube 32 of the thermal radiation shield by countersunk screws 38 and to the stiffener by welding 36. However, any appropriate method of fastening may be used.

The inner tube 32 of the thermal radiation shield is significantly strengthened by its mechanical linking to the cylindrical stiffener 30. This results in reduced mechanical vibration of the inner tube 32 in response to pulsed magnetic field from the gradient coil 23, in turn leading to reduced GCIH and reduced secondary eddy current heating of the thermal radiation shield 16. As the axial extremities are most susceptible to secondary eddy current generation, it may be found sufficient to mechanically link the stiffener 30 and the inner tube 32 only in the regions of the axial extremities, near the end coils 10a.

Figure 7:
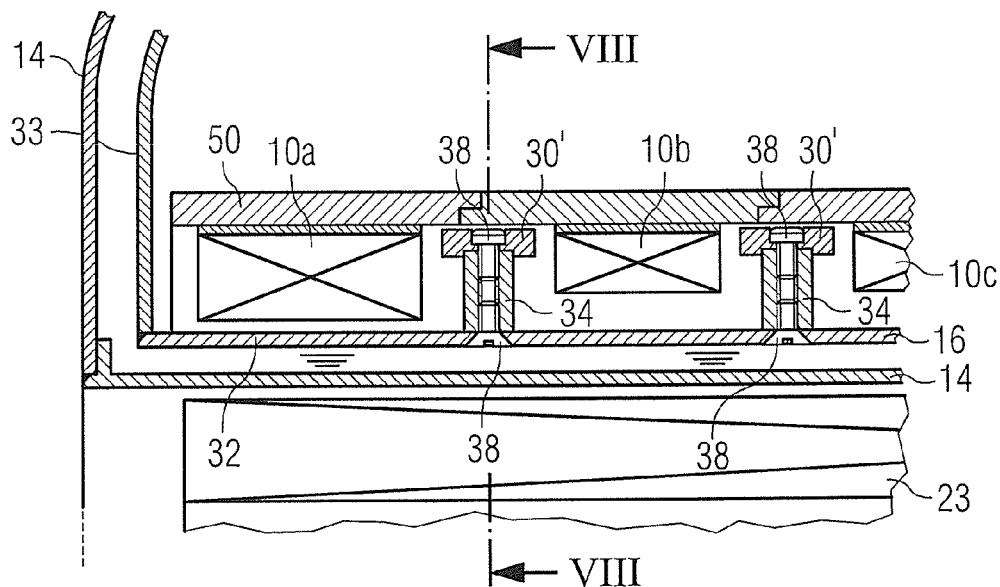
FIG. 7 shows an axial part cross-section of an embodiment of the invention.

FIG. 7 shows another part-axial cross section of another embodiment of the present invention. In this embodiment, multiple short cylindrical stiffeners 30' are provided, and each have an inner radius less than the outer radius of at least some of: the end coils 10a and the central coils 10b, 10c.

In this embodiment, the coils 10 are again mounted on an external support 50, in the manner discussed with reference to FIG. 6. However, in this case, the pillars 34 do not pass through the external support. Between coils, for example between coils 10a and 10b, a cylindrical stiffener 30' is provided, having an inner diameter less than the outer diameter of at least one of the immediately adjacent coils. The cylindrical support is essentially annular, having an axial extent less than the axial spacing between the immediately adjacent coils. Pillars 34 are provided at radial intervals around the circumference of the cylindrical support, and are attached between the cylindrical stiffener 30' and the inner tube 32 of the thermal radiation shield at radial intervals. In the illustrated embodiment, the pillars are attached by countersunk screws 38, but any suitable method for attachment may be used.

The inner tube 32 of the thermal radiation shield 16 is significantly strengthened by its mechanical linking to the cylindrical stiffeners 30'. This results in reduced mechanical vibration of the inner tube 32 in response to pulsed magnetic field from the gradient coil, in turn leading to reduced GCIH and reduced secondary eddy current heating of the thermal radiation shield 16. As the axial extremities of the inner tube 32 are most susceptible to secondary eddy current generation, it may be found sufficient to mechanically link the stiffeners 30' and the inner tube 32 only in the regions of the axial extremities, near the outer coils 10a.

Figure 8:
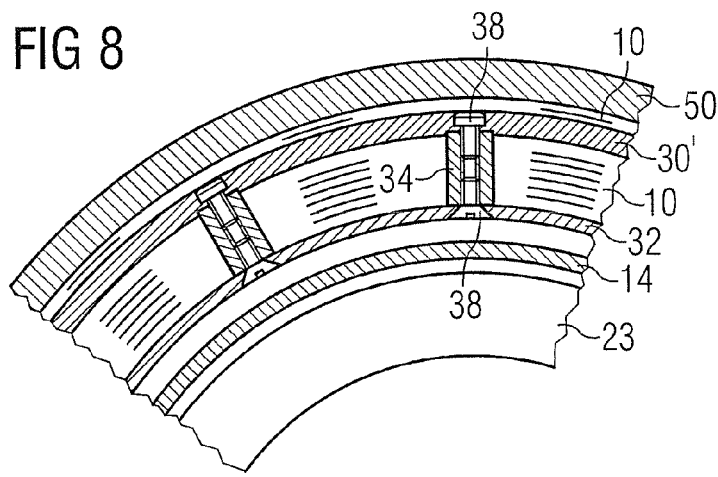
FIG. 8 shows a partial cross-section through the structure of FIG. 7.

FIG. 8 shows a partial radial cross-section through line VIII-VIII of the embodiment of FIG. 7.

In some embodiments of the invention, for example those as illustrated in FIG. 7, some or all of the pillars 34 described, mechanically linking the thermal shield to the cylindrical stiffener(s) may be replaced by one or more elongate, arcuate supports extending around a circumference of the thermal shield. In an extreme case, the elongate arcuate support(s) may be complete annular supports extending around the circumference of the thermal shield.

Figure 8A:
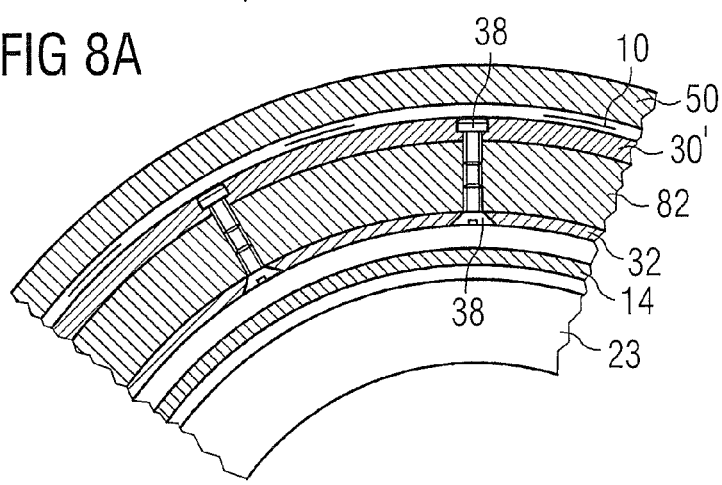
FIG. 8A shows a variant of the embodiment shown in FIG. 8.

FIG. 8A resembles FIG. 8, but illustrates an example of elongate arcuate support 82, extending around a circumference of the thermal shield 32, mechanically joining it to cylindrical stiffener 30'. Elongate arcuate support 82 may be a complete annular support extending around the circumference of the thermal shield, or may be one of several arcs, which may overlap in the circumferential direction, or may be spaced apart.

FIGS. 9A-9C illustrate alternative arrangements for annular end pieces of thermal radiation shields and outer vacuum chambers according to certain embodiments of the present invention.

In FIG. 9A, the thermal radiation shield 16 has a conventional annular end-piece 33, which is essentially planar, with some dishing at the outer radial extremity to form a convex outer surface. The outer vacuum chamber 14 has a similarly shaped annular end piece 47. This arrangement of thermal radiation shield and outer vacuum chamber resembles a conventional magnet system. The cylindrical stiffener 30 does not form a part of the outer wall of the thermal radiation shield.

In FIGS. 9B, 9C, according to an optional feature of the present invention, the cylindrical stiffener 30 forms part of the outer wall of the thermal radiation shield 16, along at least part of the axial length of the cylindrical stiffener 30.

In the arrangement of FIG. 9B, the thermal radiation shield 16 is made up of two hollow cylindrical thermal radiation shields 16a and 16b, linked by thermal radiation shields 16c shaped to surround the supports 49 holding the shield coils 10s in place. The annular thermal radiation shield 16a surrounding the inner coils and end coils 10a, 10b, 10c, uses the cylindrical stiffener 30 as its outer tube. The outer vacuum chamber 14 has shaped end pieces 56, each defining an annular cavity 58 extending around the end-piece of the OVC. Alternatively, the cavity 58 may only be part-annular, extending around part of the end-piece of the OVC. As illustrated, the end-piece may have a curved profile in axial cross-section, and may be formed by metal spinning.

In the arrangement of FIG. 9C, the end piece 64 of the thermal radiation shield 16 is composed of three annular portions 64a, 64b, 64c, each of which is essentially planar. The structure of the thermal radiation shield resembles that discussed with reference to the cryogen vessel 12 in FIG. 2. Preferably, the three portions 64a, 64b, 64c are all formed from a single planar piece of material. The annular end piece 64 has a re-entrant portion, such that radially intermediate portion 64b of the annular end piece is axially closer to the axial centre of the outer vacuum container than radially inner 64a and radially outer 64c portions of the annular end piece. The radially intermediate portion 64b is attached to radially inner 64a and radially outer 64c portions by cylindrical wall portions 64d, 64e. Cylindrical wall portion 64d is part of the cylindrical stiffener 30. The end-piece 64 thereby defines an annular cavity 62 extending around the end-piece of the thermal radiation shield, alternatively, the cavity 62 may only be part-annular, extending around part of the end-piece of the thermal radiation shield, by appropriate formation of the annular end-piece. The end piece 60 of the OVC 14 is composed of three annular portions 60a, 60b, 60c, each of which is essentially planar. The structure of the OVC resembles that discussed with reference to the cryogen vessel 12 in FIG. 2. Preferably, the three portions 60a, 60b, 60c are all formed from a single planar piece of material. The annular end piece 60 has a re-entrant portion, such that radially intermediate portion 60b of the annular end piece is axially closer to the axial centre of the outer vacuum container than radially inner 60a and radially outer 60c portions of the annular end piece. The radially intermediate portion is attached to radially inner 60a and radially outer 60c portions by cylindrical wall portions 60d, 60e. The end-piece 60 thereby defines an annular cavity 66 extending around the end-piece of the OVC, alternatively, the cavity 66 may only be part-annular, extending around part of the end-piece of the OVC, by appropriate formation of the annular end-piece.

Typically, in a completed MRI system, convex decorative 'looks' covers are placed over the OVC. Cavities 58, 66 define volumes between the OVC and the looks covers which may be used to accommodate auxiliary equipment, provided that it is tolerant of the magnetic field in that volume.

Figure 10:
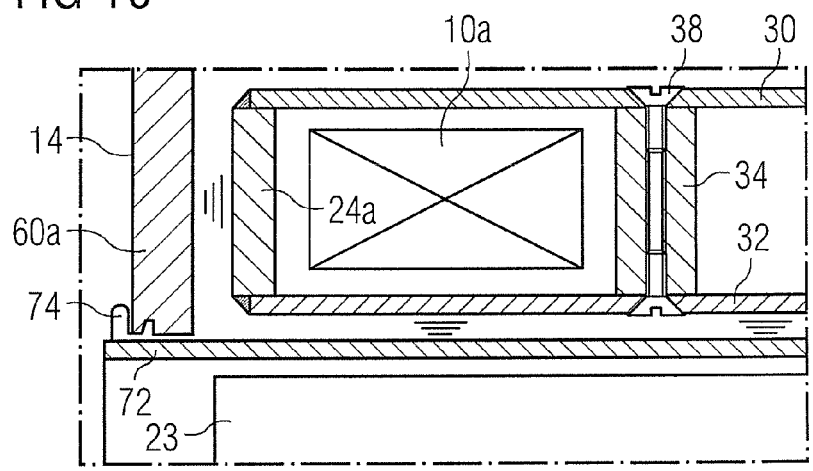
FIG. 10 shows an enlargement of a part of FIG. 9C.

FIG. 10 shows an enlargement of that part of FIG. 9C labeled X. In particular, it illustrates an optional feature of the OVC. Rather than having an inner tube 72 welded to an end piece 47; 56 using a fillet 70, as in FIGS. 9A, 9B the embodiment of FIG. 10 has a thin inner tube 72 linked to the end piece 60a of the OVC by a bellows 74. The presence of the bellows means that the inner tube 72 will not be subjected to any end loads, since atmospheric pressure tending to displace the end piece 60a of the OVC will be taken up by flexure of the end piece and displacement of the bellows 74. Since the inner tube 72 then only has to resist atmospheric pressure acting on its inner surface, it may be made very thin. Use of a thin inner tube provides several advantages, for example, a reduction in weight and material cost of the OVC, opportunity to increase the bore diameter of the OVC for increased patient comfort; or reduce the diameter of the coils for reduced wire cost, or a combination of the two. The bellows 74 is preferably a single convolution bellows.

Use of such a thin OVC inner tube, immune to end-loads, allows its resonant frequency to become significantly separated from that of the stiffened inner tube 32 of the thermal radiation shield. The bore tube 32 of the thermal radiation shield may be made much thinner than is conventional, as quench forces acting on it are reacted by stiffened sections of the shield end and inner tube.

The invention allows a large degree of 'tuning' of resonant behavior of shield structure, to ensure separation of the resonant frequencies of the inner tubes of the thermal radiation shield, OVC and cryogen vessel, if any.

While the present invention has been described with reference to a limited number of example embodiments, various modifications and variations will be apparent to those skilled in the art. For example, while pillars 34 have been illustrated joining the cylindrical stiffener 30 to the inner tube 32, any other suitable mechanical joints may be employed. For example, in each embodiment where a pillar 34 has been described, a hollow through-bore, such as shown at 40 in FIG. 2, may be provided instead. The use of such a through-bore may provide improved mechanical rigidity as compared to a solid pillar, and may usefully provide access for electrical conductors or other services between coils of the magnet. The dynamic behavior of the inner tube 32 and the stiffener 30 may be affected differently if hollow through-bores are used instead of solid pillars, and this differing, dynamic behavior may advantageously be used to ensure separation of the resonant frequencies of the various concentric tubes.

Figure 11:
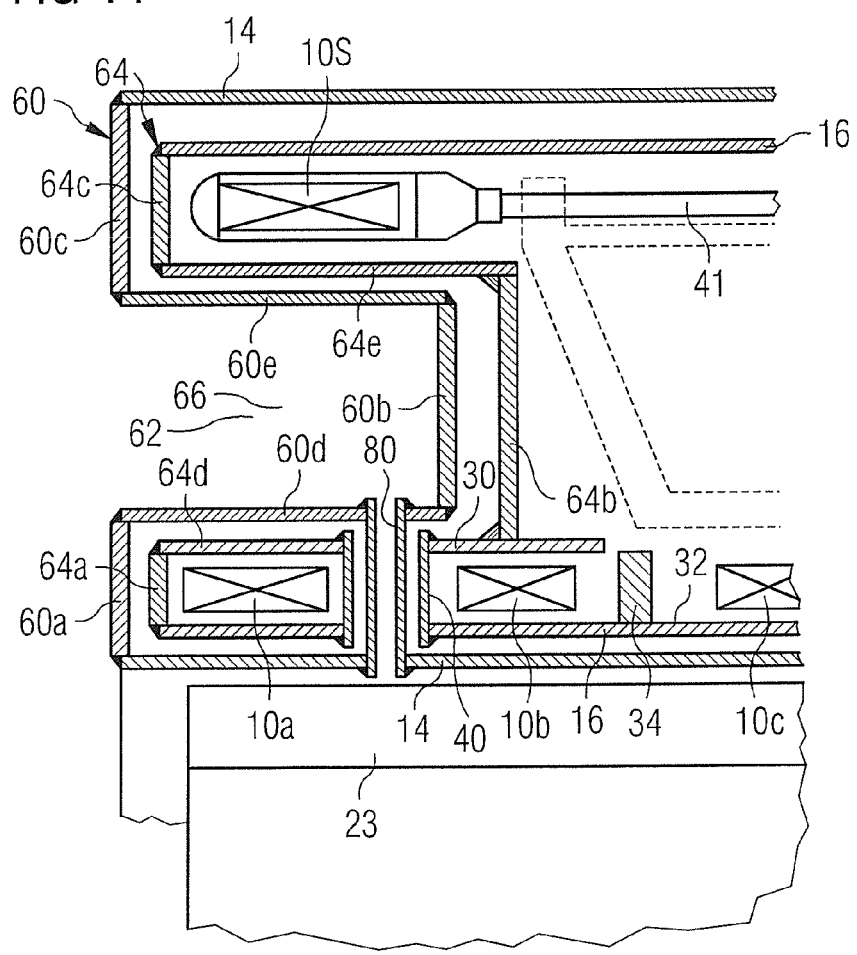
FIGS. 11-12 illustrate a detail of certain embodiments of the invention.
Figure 12:
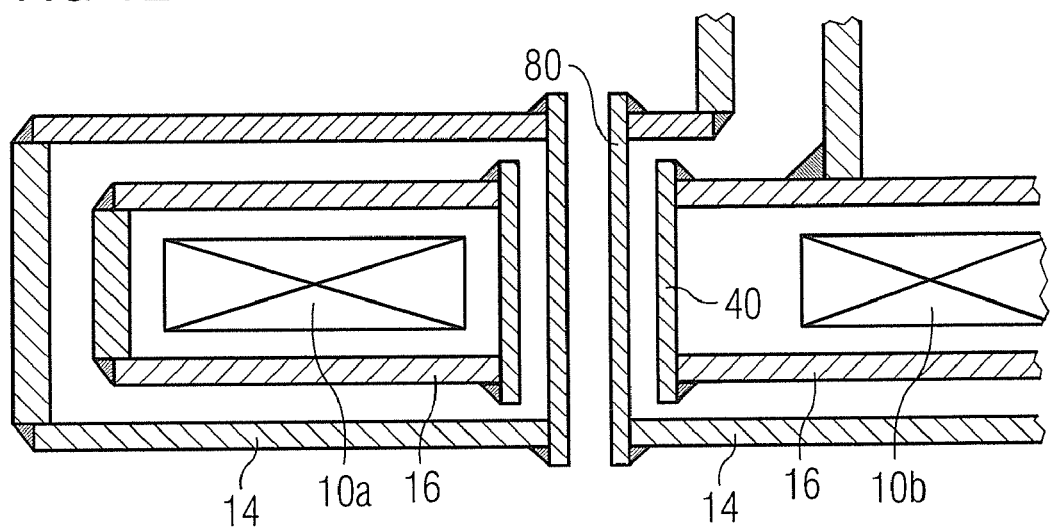

In an embodiment such as shown in FIG. 11, through-bores 80 are provided through the OVC, with through-bores 40 of larger diameter being provided through the thermal radiation shield. An enlargement of part of FIG. 11 is shown in FIG. 12. In the illustrated embodiment, no cryogen vessel is provided, but a similar embodiment could be constructed in which further through-bores, concentric with through-bores 40, 80, are provided linking inner and outer cylindrical walls of the cryogen vessel. By providing such through-bores in the OVC, a useful route for passing electrical cables and other services is provided, which may prove particularly useful for embodiments on which auxiliary equipment is provided within recess 25.

Such through-bores are preferably welded in position, as schematically illustrated in FIGS. 11 and 12, for mechanical strength and vacuum tightness.

Pillar 34 illustrated in FIG. 11, and the corresponding feature in the embodiment of FIG. 9 may be replaced by one or more elongate arcuate supports 82 as illustrated in FIG. 8A and as described in the accompanying description, to provide increased stiffness to the thermal radiation shield.

The provision of through-bores through the OVC may increase its mechanical strength in regions susceptible to GCIH, and may enable thinner materials to be used. Typically, it will be found sufficient to provide through-bores 80 through the OVC 14 only at some of the through-bores 40 of the thermal radiation shield 16. The distribution of OVC through-bores 80 may be determined to provide a required dynamic behavior, and to advantageously separate the resonant frequency of the inner tube of the OVC away from the resonant frequency of the inner tube of the thermal radiation shield.

Although modifications and changes may be suggested by those skilled in the art, it is the intention of the inventor to embody within the patent warranted hereon all changes and modifications as reasonably and properly come within the scope of his contribution to the art.

I claim as my invention:

1. A hollow cylindrical thermal shield for a tubular cryogenically cooled superconducting magnet having a first axis and comprising an annular coil, comprising:
    an inner cylindrical tube having an axis aligned with the first axis;
    an outer cylindrical tube of a diameter greater than a diameter of the inner cylindrical tube and having an axis aligned with the first axis;
    annular end pieces joining the inner cylindrical tube and the outer cylindrical tube to form an enclosure; and
    a cylindrical stiffener extending axially at least part of an axial length of the inner cylindrical tube, the stiffener having a radially inner diameter greater than a radially outer diameter of the annular coil and being joined at intervals to the inner cylindrical tube such that the inner cylindrical tube lies radially within the annular coil, while the stiffener lies radially outside of the annular coil, to thereby improve mechanical rigidity of the inner cylindrical tube.

2. A hollow cylindrical thermal shield according to claim 1 wherein the cylindrical stiffener is joined to the inner cylindrical tube by pillars placed at intervals.

3. A hollow cylindrical thermal shield according to claim 1 wherein the cylindrical stiffener is joined to the inner cylindrical tube by hollow through-bores placed at intervals.

4. A hollow cylindrical thermal shield according to claim 1 wherein the stiffener is located adjacent to one of the annular end pieces and is mechanically attached thereto.

5. A hollow cylindrical thermal shield according to claim 3 wherein the stiffener extends between the annular end pieces and is mechanically attached thereto.

6. A hollow cylindrical thermal shield according to claim 3 wherein at least part of the stiffener forms part of said one annular end piece of the thermal shield.

7. A thermal shield for a tubular cryogenically cooled superconducting magnet having a first axis and comprising adjacent annular coils, comprising:
    an inner cylindrical tube having an axis aligned with the first axis;
    an outer cylindrical tube of a diameter greater than a diameter of the inner cylindrical tube and having an axis aligned with the first axis;
    annular end pieces joining the inner cylindrical tube and the outer cylindrical tube to form an enclosure; and
    a cylindrical support extending between the adjacent annular coils and having an inner diameter less than an outer diameter of at least one of the adjacent annular coils and having an axial extent less than an axial spacing between the adjacent coils and being joined at intervals to the inner cylindrical tube to thereby improve mechanical rigidity of the inner cylindrical tube.

8. A thermal shield according to claim 7 wherein the cylindrical support is joined to the inner cylindrical tube by pillars placed at intervals.

9. A thermal shield according to claim 7 wherein the cylindrical support is joined to the inner cylindrical tube by hollow through-bores placed at intervals.

10. A thermal shield according to claim 7 wherein at least one of the annular end pieces is formed in three axially concentric pieces located at at least two separate axial locations such that radially inner and radially outer pieces of said three concentric pieces of the end piece are positioned to accommodate respective inner and outer coils of the cryogenically cooled magnet, while a radially intermediate piece of said three concentric pieces of the end piece is positioned axially nearer an axial center of the thermal shield than the corresponding radially inner and radially outer pieces.

11. A thermal shield according to claim 10 wherein the three axially concentric pieces are all planar and are arranged perpendicular to the first axis.

12. A thermal shield according to claim 10, wherein the radially intermediate piece is frusto-conical such that a radially outer extremity of the radially intermediate piece is axially further from an axial center of the thermal shield than a radially inner extremity of the radially intermediate piece.

13. A magnet system, comprising:
  a hollow cylindrical thermal shield for a tubular cryogenically cooled superconducting magnet having a first axis and comprising adjacent annular coils, said thermal shield comprising
    an inner cylindrical tube having an axis aligned with the first axis,
    an outer cylindrical tube of greater diameter than a diameter of the inner cylindrical tube and having an axis aligned with the first axis,
    annular end pieces joining the inner cylindrical tube and the outer cylindrical tube to form an enclosure, and
    a cylindrical stiffener extending axially at least part of an axial length of the inner cylindrical tube, the stiffener having a radially inner diameter greater than a radially outer diameter of the annular coil and being joined at intervals to the inner cylindrical tube such that the inner cylindrical tube lies radially within the annular coil, while the stiffener lies radially outside of the annular coil, to thereby improve mechanical rigidity of the inner cylindrical tube;
  a hollow cylindrical outer vacuum container having a second axis and enclosing the thermal shield and the coils; and
  the outer vacuum container comprising
    an inner cylindrical tube having an axis aligned with the second axis,
    an outer cylindrical tube of a diameter greater than a diameter of the inner cylindrical tube and having an axis aligned with the second axis,
    annular end pieces joining the inner cylindrical tube and the outer cylindrical tube to form an enclosure, and
    one of the annular end pieces having a re-entrant portion such that a radially intermediate portion of the annular end piece is axially closer to an axial center of the outer vacuum container than radially inner and radially outer extremities of the annular end piece, and the re-entrant portion being joined at intervals to the inner cylindrical tube to thereby improve mechanical rigidity of the inner cylindrical tube of the outer vacuum chamber.

14. A magnet system according to claim 13 wherein the re-entrant portion of the outer vacuum chamber is joined at intervals to the inner cylindrical tube of the outer vacuum chamber by through-bores.

15. A magnet system, comprising:
  a hollow cylindrical thermal shield for a tubular cryogenically cooled superconducting magnet having a first axis and comprising adjacent annular coils, said thermal shield comprising
    an inner cylindrical tube having an axis aligned with the first axis,
    an outer cylindrical tube of greater diameter than a diameter of the inner cylindrical tube and having an axis aligned with the first axis,
    annular end pieces joining the inner cylindrical tube and the outer cylindrical tube to form an enclosure, and
    a cylindrical stiffener extending axially at least part of an axial length of the inner cylindrical tube, the stiffener having a radially inner diameter greater than a radially outer diameter of the annular coil and being joined at intervals to the inner cylindrical tube such that the inner cylindrical tube lies radially within the annular coil, while the stiffener lies radially outside of the annular coil, to thereby improve mechanical rigidity of the inner cylindrical tube;
  a hollow cylindrical outer vacuum container having a second axis and enclosing the thermal shield and the coils; and
  the outer vacuum container comprising
    an inner cylindrical tube having an axis aligned with the second axis,
    an outer cylindrical tube of a diameter greater than a diameter of the inner cylindrical tube and having an axis aligned with the second axis,
    annular end pieces joining the inner cylindrical tube and the outer cylindrical tube to form an enclosure, and
    the inner cylindrical tube being joined to one of the annular end pieces by a bellows.

16. A magnet system according to claim 15 wherein one of the annular end pieces of the outer vacuum container has a re-entrant potion such that a radially intermediate portion of the annular end piece is axially closer to an axial center of the outer vacuum container than radially inner and radially outer extremities of the annular end piece.

17. A magnet system, comprising:
  a hollow cylindrical thermal shield for a tubular cryogenically cooled superconducting magnet having a first axis and comprising adjacent annular coils, said thermal shield comprising
    an inner cylindrical tube having an axis aligned with the first axis,
    an outer cylindrical tube of greater diameter than a diameter of the inner cylindrical tube and having an axis aligned with the first axis,
    annular end pieces joining the inner cylindrical tube and the outer cylindrical tube to form an enclosure, and
    a cylindrical stiffener extending axially at least part of an axial length of the inner cylindrical tube, the stiffener having a radially inner diameter greater than a radially outer diameter of the annular coil and being joined at intervals to the inner cylindrical tube such that the inner cylindrical tube lies radially within the annular coil, while the stiffener lies radially outside of the annular coil, to thereby improve mechanical rigidity of the inner cylindrical tube;
  a hollow cylindrical cryogen vessel having a third axis and enclosing the coils; and
  the cryogen vessel comprising
    an inner cylindrical tube having an axis aligned with the third axis,
    an outer cylindrical tube of a diameter greater than a diameter of the inner cylindrical tube and having an axis aligned with the third axis,
    annular end pieces joining the inner cylindrical tube and the outer cylindrical tube to form an enclosure, and
    the inner cylindrical tube being joined to one of the annular end pieces by a bellows.

18. A magnet system according to claim 17 wherein one of the annular end pieces of the cryogen vessel has a re-entrant portion such that a radially intermediate portion of the annular end piece is axially closer to an axial center of the outer vacuum container than radially inner and radially outer extremities of the annular end piece.

19. A magnet system according to claim 17 wherein at least some of the coils are mounted on a cylindrical former.

20. A hollow cylindrical thermal shield for a tubular cryogenically cooled superconducting magnet having a first axis and comprising adjacent annular coils, comprising:
  an inner cylindrical tube having an axis aligned with the first axis;

an outer cylindrical tube of a diameter greater than a diameter of the inner cylindrical tube and having an axis aligned with the first axis;
annular end pieces joining the inner cylindrical tube and the outer cylindrical tube to form an enclosure; and
a cylindrical support extending between the adjacent annular coils and having an inner diameter less than an outer diameter of at least one of the adjacent annular coils and having an axial extent less than an axial spacing between the adjacent coils and being joined at intervals to the inner cylindrical tube, to thereby improve mechanical rigidity of the inner cylindrical tube.

21. A hollow cylindrical thermal shield according to claim 20 wherein the cylindrical support is joined to the inner cylindrical tube by pillars placed at intervals.

22. A hollow cylindrical thermal shield according to claim 20 wherein the cylindrical support is joined to the inner cylindrical tube by hollow through-bores placed at intervals.

23. A hollow cylindrical thermal shield according to claim 20 wherein at least one of the annular end pieces is formed in three axially concentric pieces located at at least two separate axial locations such that radially inner and radially outer pieces of said three concentric pieces of the end piece are positioned to accommodate respective inner and outer coils of the cryogenically cooled magnet while a radially intermediate piece of said three concentric pieces of the end piece is positioned axially nearer an axial center of the thermal shield than the corresponding radially inner and radially outer pieces.

24. A hollow cylindrical thermal shield according to claim 23 wherein the three axially concentric pieces are all planar and are arranged perpendicular to the first axis.

25. A hollow cylindrical thermal shield according to claim 23 wherein the radially intermediate piece is frusto-conical such that a radially outer extremity of the radially intermediate piece is axially further from the axial center of the thermal shield than a radially inner extremity of the radially intermediate piece.

26. A magnet system, comprising:
a hollow cylindrical thermal shield for a tubular cryogenically cooled superconducting magnet having a first axis and comprising adjacent annular coils, said thermal shield comprising
an inner cylindrical tube having an axis aligned with the first axis,
an outer cylindrical tube of greater diameter than a diameter of the inner cylindrical tube and having an axis aligned with the first axis,
annular end pieces joining the inner cylindrical tube and the outer cylindrical tube to form an enclosure, and
a cylindrical support extending between the adjacent annular coils and having an inner diameter less than an outer diameter of at least one of the adjacent annular coils and having an axial extent less than an axial spacing between the adjacent coils and being joined at intervals to the inner cylindrical tube, to thereby improve mechanical rigidity of the inner cylindrical tube;
a hollow cylindrical outer vacuum container having a second axis and enclosing the thermal shield and the coils; and
the outer vacuum container comprising
an inner cylindrical tube having an axis aligned with the second axis,
an outer cylindrical tube of a diameter greater than a diameter of the inner cylindrical tube and having an axis aligned with the second axis,
annular end pieces joining the inner cylindrical tube and the outer cylindrical tube to form an enclosure, and
one of the annular end pieces of the outer vacuum container having a re-entrant portion such that a radially intermediate portion of the annular end piece is axially closer to an axial center of the outer vacuum container than radially inner and radially outer extremities of the annular end piece, and the re-entrant portion of the outer vacuum chamber to thereby improve a mechanical rigidity of the inner cylindrical tube of the outer vacuum chamber.

27. A magnet system according to claim 26 wherein the re-entrant portion of the outer vacuum chamber is joined at intervals to the inner cylindrical tube of the outer vacuum chamber by through-bores.

28. A magnet system, comprising:
a hollow cylindrical thermal shield for a tubular cryogenically cooled superconducting magnet having a first axis and comprising adjacent annular coils, said thermal shield comprising
an inner cylindrical tube having an axis aligned with the first axis,
an outer cylindrical tube of greater diameter than a diameter of the inner cylindrical tube and having an axis aligned with the first axis,
annular end pieces joining the inner cylindrical tube and the outer cylindrical tube to form an enclosure, and
a cylindrical support extending between the adjacent annular coils and having an inner diameter less than an outer diameter of at least one of the adjacent annular coils and having an axial extent less than an axial spacing between the adjacent coils and being joined at intervals to the inner cylindrical tube, to thereby improve mechanical rigidity of the inner cylindrical tube;
a hollow cylindrical outer vacuum container having a second axis and enclosing the thermal shield and the coils; and
the outer vacuum container comprising
an inner cylindrical tube having an axis aligned with the second axis,
an outer cylindrical tube of a diameter greater than a diameter of the inner cylindrical tube and having an axis aligned with the second axis,
annular end pieces joining the inner cylindrical tube and the outer cylindrical tube to form an enclosure, and
the inner cylindrical tube being joined to one of the annular end pieces by a bellows.

29. A magnet system according to claim 28 where one of the annular end pieces of the outer vacuum container have a re-entrant portion such that a radially intermediate portion of the annular end piece is axially closer to an axial center of the outer vacuum container than radially inner and radially outer extremities of the annular end piece.

30. A magnet system, comprising:
a hollow cylindrical thermal shield for a tubular cryogenically cooled superconducting magnet having a first axis and comprising adjacent annular coils, said thermal shield comprising
an inner cylindrical tube having an axis aligned with the first axis,
an outer cylindrical tube of greater diameter than a diameter of the inner cylindrical tube and having an axis aligned with the first axis,
annular end pieces joining the inner cylindrical tube and the outer cylindrical tube to form an enclosure, and a cylindrical support extending between the adjacent annular coils and having an inner diameter less than an outer diameter of at least one of the adjacent annular coils and having an axial extent less than an axial spacing between the adjacent coils and being joined at intervals to the inner cylindrical tube, to thereby improve mechanical rigidity of the inner cylindrical tube;

a hollow cylindrical cryogen vessel having a third axis and enclosing the coils; and the cryogen vessel comprising
- an inner cylindrical tube having an axis aligned with the third axis,
- an outer cylindrical tube of a diameter greater than a diameter of the inner cylindrical tube and having an axis aligned with the third axis,
- annular end pieces joining the inner cylindrical tube and the outer cylindrical tube to form an enclosure, and
- the inner cylindrical tube being joined to one of the annular end pieces by a bellows.

31. A magnet system according to claim 30 wherein one of the annular end pieces of the cryogen vessel have a re-entrant portion such that a radially intermediate portion of the annular end piece is axially closer to an axial center of the outer vacuum container than radially inner and radially outer extremities of the annular end piece.

32. A magnet system according to claim 30 wherein at least some of the coils are mounted on a cylindrical former.

* * * * *